(12) United States Patent
Plessky et al.

(10) Patent No.: US 6,940,368 B2
(45) Date of Patent: Sep. 6, 2005

(54) SURFACE ACOUSTIC WAVE FILTER

(75) Inventors: Victor Plessky, Bevaix (CH); Laurent Kopp, Valbonne (FR)

(73) Assignee: Thales, Paris (FR)

( * ) Notice: Subject to any disclaimer, the term of this patent is extended or adjusted under 35 U.S.C. 154(b) by 38 days.

(21) Appl. No.: 10/469,813

(22) PCT Filed: Mar. 1, 2002

(86) PCT No.: PCT/FR02/00760
§ 371 (c)(1),
(2), (4) Date: Sep. 4, 2003

(87) PCT Pub. No.: WO02/071610
PCT Pub. Date: Sep. 12, 2002

(65) Prior Publication Data
US 2004/0070469 A1  Apr. 15, 2004

(30) Foreign Application Priority Data
Mar. 6, 2001 (FR) .............................................. 01 03041

(51) Int. Cl.⁷ ................................................. H03H 9/64
(52) U.S. Cl. ...................................... 333/193; 333/195
(58) Field of Search ................................ 333/193, 195; 310/311, 313 R, 313 B

(56) References Cited

U.S. PATENT DOCUMENTS 5,499,003 A  *  3/1996  Davenport .................. 333/195
5,682,126 A      10/1997  Plesski et al. ............... 333/193
5,790,000 A  *   8/1998  Dai et al. .................... 333/193
5,892,418 A      4/1999   Onishi et al. ............... 333/193
6,081,172 A  *   6/2000   Strauss et al. .............. 333/193
6,549,100 B2 *   4/2003   Taniguchi ................... 333/193
6,600,390 B2 *   7/2003   Frank ......................... 333/189

FOREIGN PATENT DOCUMENTS

EP    0 642 220 A    3/1995    ............ H03H/9/64
EP    0 718 970 A    6/1996    ............ H03H/9/64
EP    0 772 293 A    5/1997    ............ H03H/9/64
EP    0810727 A2     12/1997   ............ H03H/9/64

* cited by examiner

Primary Examiner—Dean Takaoka
(74) Attorney, Agent, or Firm—Lowe Hauptman & Berner, LLP

(57) ABSTRACT

The invention relates to a surface acoustic wave filter (or SAW filter) comprising a symmetrical network with differential inputs/outputs, in particular for mobile telecommunication systems. A network of the ladder or balanced bridge type comprises at least one structure of the surface acoustic wave resonator type, that comprises at least two transducers in the same acoustic channel, two of said transducers being substantially identical, connected to two symmetrical branches of the network and arranged in such a way that the acoustic waves generated by the two transducers are in phase. Advantageously, arrays of reflectors are placed on either side of the structure. Apart from saving space, this structure makes it possible in particular to simplify the production of the filter and to achieve better control in balancing the branches.

21 Claims, 8 Drawing Sheets

SURFACE ACOUSTIC WAVE FILTER

CROSS-REFERENCE TO RELATED APPLICATION

The present Application is based on International Application No. PCt/FR02/00760, filed on Mar. 1, 2002, entitled "SURFACE ACOUSTIC WAVE FILTER", which in turn corresponds to French Application FR 01/03041 filed Mar. 6, 2001, and priority is hereby claimed under 35 USC Section 119 based on these applications. Each of these applications are hereby incorporated by reference in their entirety into this application.

FIELD OF THE INVENTION

The invention relates to a surface acoustic wave filter (or SAW filter) comprising a symmetrical network with differential inputs/outputs, in particular for mobile telecommunication systems. The term "surface wave" is understood here to mean not only Rayleigh waves but also any type of wave that can interact with combs of electrodes on the surface of a crystal or at the interface between a crystal and one or more layers of any material. The waves called pseudo acoustic surface waves, transverse surface waves or SSBW-type surface waves may thus be considered as surface waves and the invention applies to this type of wave and to any other type of wave meeting the above conditions.

BACKGROUND OF THE INVENTION

The technology of surface acoustic waves has found many applications in the electronics and radiofrequency field. Because the wavelengths of acoustic waves are typically $10^5$ times shorter than those of electromagnetic waves of the same frequency, this technology is particularly beneficial in applications for which miniaturization is necessary or desirable. This is the case, for example, in telephony, in which the small dimensions as well as the weight of SAW filters make components thereof highly advantageous compared with other technologies.

In general, the desirable characteristics of SAW filters are low insertion losses, a good form factor and very good rejection around the passband. Among SAW filters reputed to have such characteristics, mention may especially be made of what are called "ladder" SAW filters, two examples of which are shown in FIGS. 1A and 1B. These filters comprise SAW elements (labeled IE in the figures), for example SAW resonators of known type, that are electrically connected in cascade. The operation of these filters is described, for example, in "Advances in surface acoustic wave technology, systems and applications", Vol. 2, pp. 67–72 (edited by C. W. Ruppel and A. Fjedly). These elements are acoustically independent and are conventionally modeled as electrical impedance elements, the admittance of which has, around a central frequency, a maximum and a minimum at frequencies called the resonant frequency and the antiresonant frequency, respectively. In what follows, these elements will simply be called "impedance elements", which term may refer to any type of SAW element ("IDT" transducer with interdigitated electrodes, SAW resonator, or the like) used at least partly for its electrical impedance properties. In practice, these filters are conventionally produced by depositing various impedance elements on the same substrate, these elements being electrically and acoustically independent SAW resonators. To do this, in general each resonator has a specific acoustic channel. The possibility of grouping impedance elements in one and the same acoustic channel has been described (see U.S. Pat. No. 5,682,126) so as to reduce the footprint on the substrate while maintaining their acoustic independence. The elements thus grouped must be separated sufficiently from the acoustic standpoint in order not to mutually interfere.

The SAW filters shown in FIGS. 1A and 1B represent, respectively, a "nondifferential"-type arrangement (with a ground connection) and a symmetrical "differential"-type arrangement in which the useful signal is conveyed in the difference existing between the two electrical components (denoted + and –) that constitute the input (IN) or the output (OUT) of the filter. This arrangement comprises a network with symmetrical branches, the symmetry being defined with respect to an axis denoted ($\Delta$) in FIG. 1B, lying parallel to the two branches denoted [AC] and [BD] and between them, the branch [AC] connecting the + component of the input to the + component of the output, and the branch [BD] connecting the – component of the input to the – component of the output. There is an increasing tendency in electronics for this type of arrangement with differential inputs/outputs to be preferred, this offering many advantages in integrated-circuit technology, especially greater efficiency from the standpoint of amplification and much greater noise immunity compared with that of nondifferential arrangements.

Of course, in a radio frequency-type system for example, the input point is an antenna, the signal of which is conventionally referenced with respect to ground. A filter designed for this type of application may then include a transformer-type stage using a SAW filter of the CRF/DMS (Coupled Resonator Filter/Double Mode Structure) type which, in addition to filtering, converts a nondifferential input into a differential input that is in turn applied to the input of a symmetrical array of impedance elements with differential inputs/outputs, as shown for example in FIG. 1B. A CRF/DMS-type stage is, for example, disclosed in patent application EP 0 810 727 in the name of Fujitsu.

SUMMARY OF THE INVENTION

The invention applies especially to this type of network and relates to a method of grouping surface acoustic wave impedance elements that are positioned on the symmetrical branches of a network with differential inputs/outputs, as shown, for example in FIG. 1B, and which are located in electrically equivalent positions so as to produce a single structure with two transducers that interact from the acoustic standpoint, making it possible to simplify the production of the filter, to increase efficiency thereof, to allow better control of the balancing of the branches and to save space.

More precisely, the invention proposes a surface acoustic wave filter that includes a network of impedance elements with differential inputs/outputs, which is composed of symmetrical branches, characterized in that said network comprises at least one structure of the surface acoustic wave resonator type, comprising, in the same acoustic channel, at least two transducers, two of said transducers being substantially identical, that are connected to two symmetrical branches of the network, in positions that are equivalent from the electrical standpoint, and are arranged in such a way that the acoustic waves generated by the said two transducers are in phase.

It applies especially to a mobile or stationary communication system.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

BRIEF DESCRIPTION OF THE DRAWINGS

Other advantages and features of the invention will become more clearly apparent on reading the description that follows, illustrated by the figures which show.

DETAILED DESCRIPTION OF THE INVENTION

In general, the invention applies to any surface acoustic wave filter comprising a symmetrical network of impedance elements, in which may be found, in two symmetrical branches of the network, at least two elements having the same impedance and located in electrically equivalent positions, that is to say when the filter is in operation, these elements have, between their + and − terminals, the same potential difference and the same current flows through them. They may, for example, be "ladder filter" or "balanced bridge filter"-type networks.

Figure 1A:
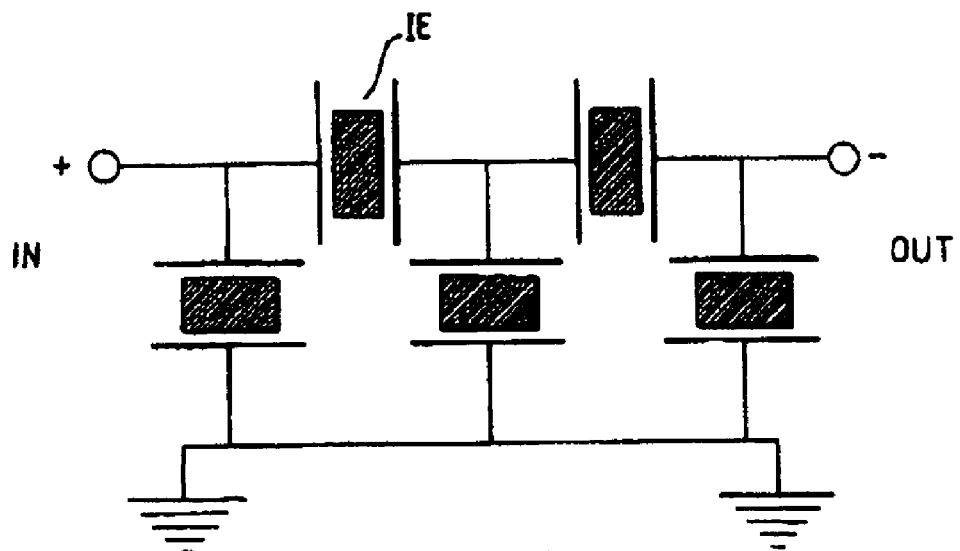
FIGS. 1A and 1B, circuit diagrams of networks of impedance elements, of the nondifferential and differential type respectively (these already having been described)
Figure 1B:
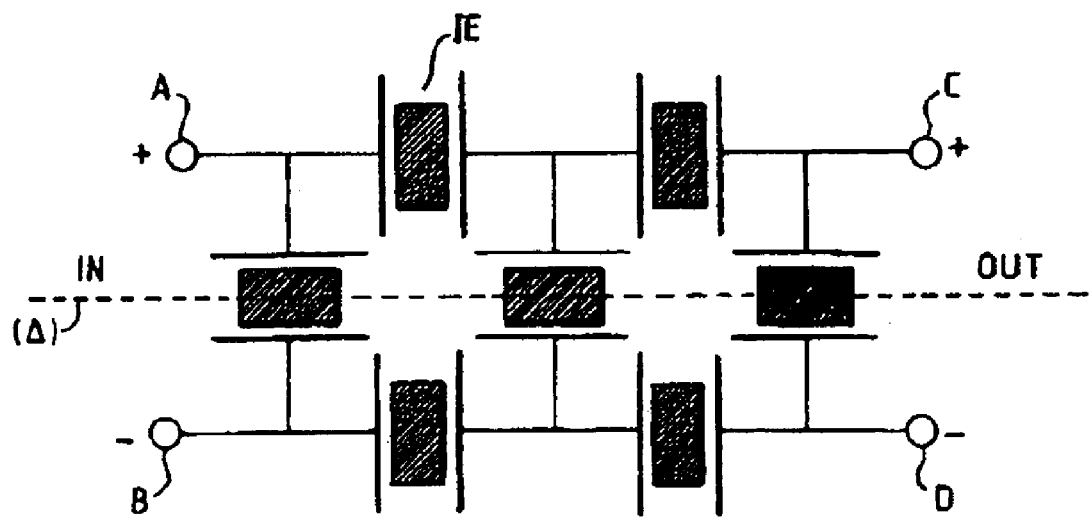
Figure 2:
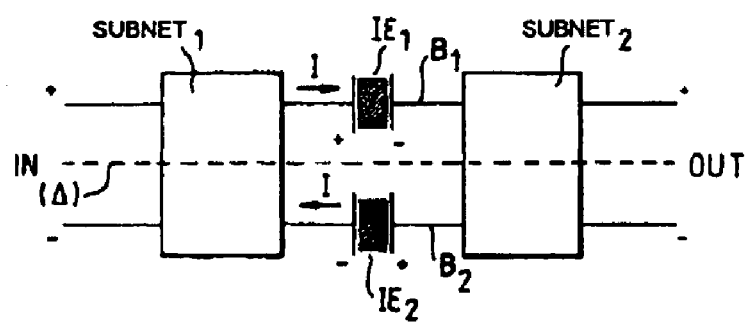
FIG. 2, the circuit diagram for an example of a network with differential inputs/outputs to which the invention applies.

FIG. 2 thus illustrates the circuit diagram of an example of a network with differential inputs/outputs, denoted respectively by IN and OUT, which shows, in a relatively complex electrical structure indicated schematically by a first symmetrical subnetwork $SUBNET_1$ and by a second symmetrical subnetwork $SUBNET_2$, two impedance elements $IE_1$ and $IE_2$, of approximately the same impedance, that are positioned in symmetrical branches $B_1$ and $B_2$ of the network and in electrically equivalent positions. In all the figures, ($\Delta$) denotes the axis of symmetry of the network, as defined above. The elements $IE_1$ and $IE_2$ are not necessarily connected together but, when the filter is in operation, they are supplied with the same voltage and the same current I flows through them.

Conventionally, and naturally, the physical construction of this type of filter is produced by depositing, on the same substrate, at discrete places, the various impedance elements, formed for example by SAW resonators having separate acoustic channels, the resonators thus being connected neither electrically nor acoustically, so as to behave independently. The invention provides an alternative construction to that of the prior art, in which two impedance elements, located in the network in the symmetrical branches and in equivalent positions (such as $IE_1$ and $IE_2$ in the example shown in FIG. 2) are grouped together to form a single resonator-type structure with at least two transducers that "work" together. According to the invention, this structure comprises more precisely at least two, substantially identical, transducers in one and the same acoustic channel, that are connected in symmetrical branches and arranged in such a way that the waves generated by the two transducers are in phase at a frequency close to the central frequency of the filter. In particular, the transducers must be arranged in such a way that the phase of the voltage that is applied to them allows them to work synchronously, ensuring constructive interference between the acoustic waves generated by the transducers.

Figure 3A:
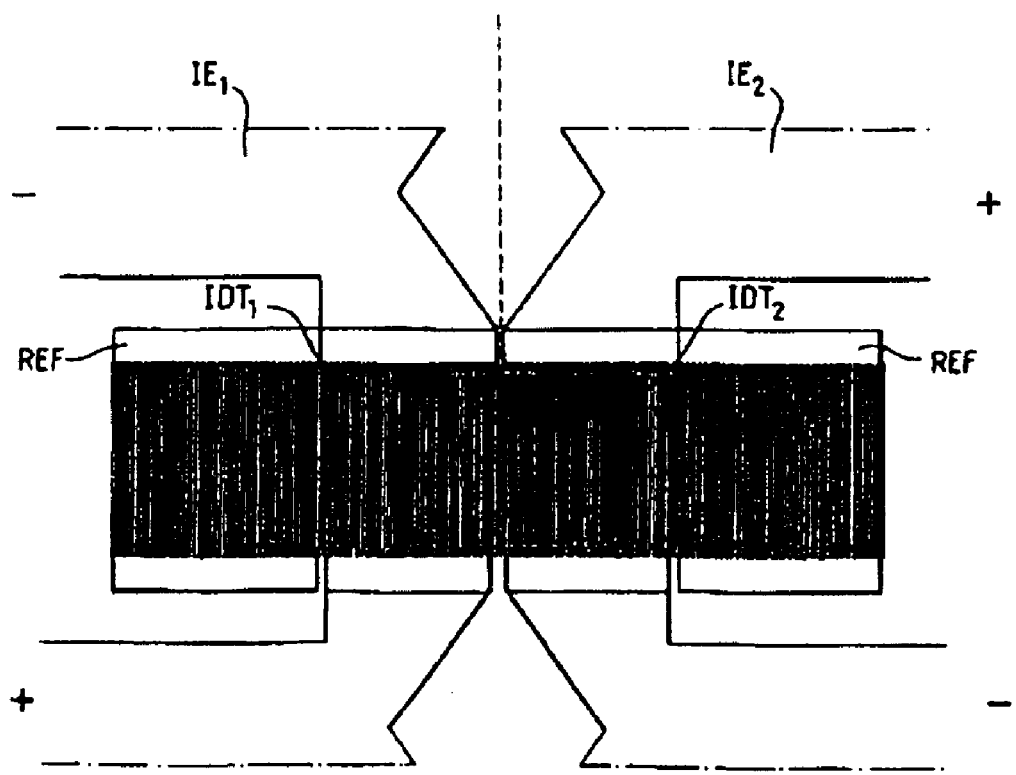
FIGS. 3A and 3B, a diagram illustrating one embodiment of a structure of the resonator type in a filter according to the invention and an enlarged detail of this structure, respectively.
Figure 3B:
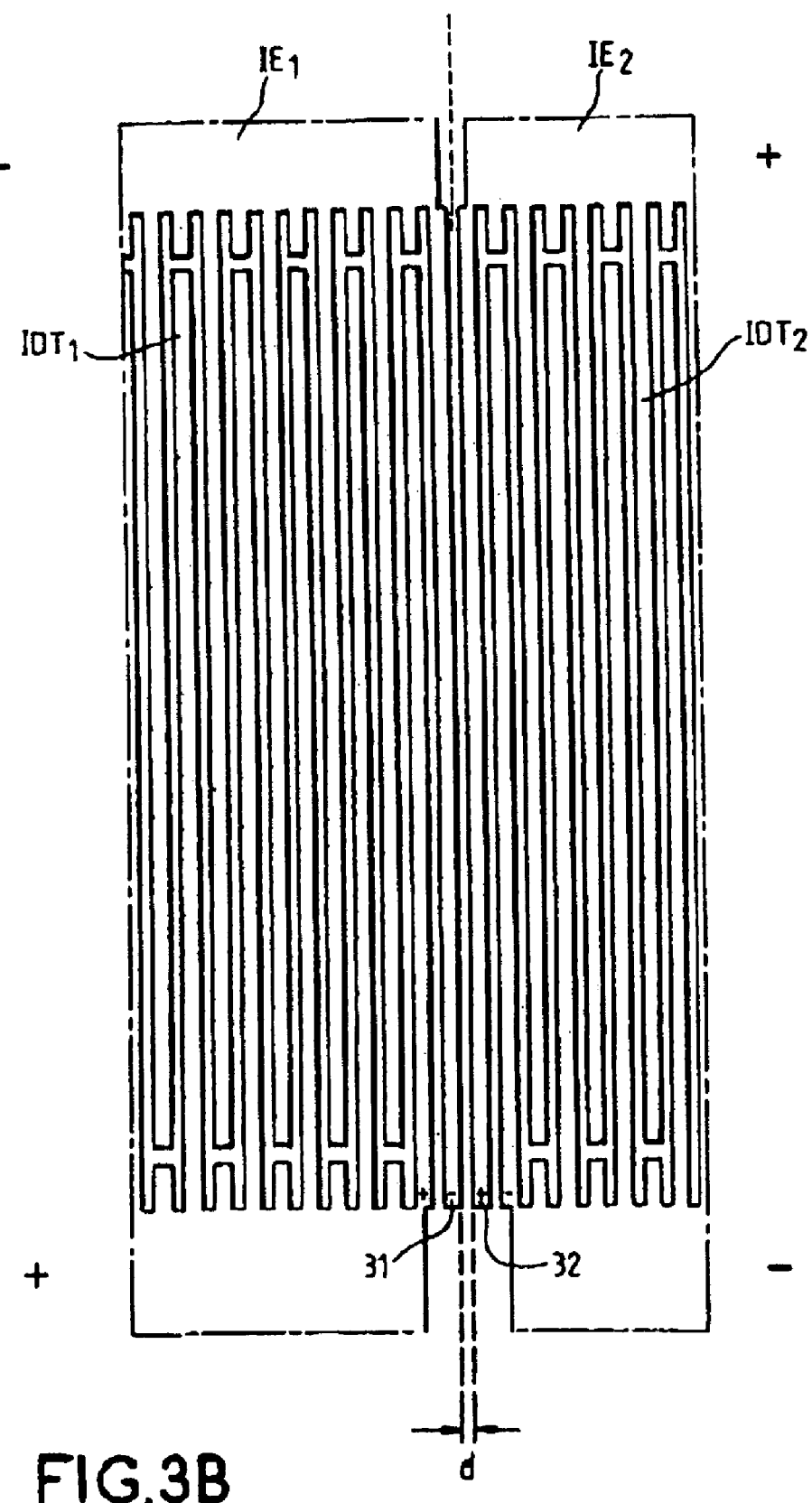

FIGS. 3A and 3B illustrate an embodiment of such a structure. FIG. 3B shows an enlarged detail of the central region of the structure shown in FIG. 3A. In this embodiment, two impedance elements of the type of those shown in FIG. 2 ($IE_1$ and $IE_2$) are grouped together. According to the invention, the resonators forming the impedance elements $IE_1$ and $IE_2$ are grouped together in a single structure in such a way as to share the same acoustic channel, while remaining electrically separate. A dotted line in the figures separates the two connection regions of the structure, corresponding to the two elements $IE_1$ and $IE_2$ respectively. In the embodiment shown in FIG. 3A, the single structure according to the invention comprises two substantially identical transducers with interdigitated electrodes $IDT_1$ and $IDT_2$ that are separate and connected in two symmetrical branches of the network (electrical connection points denoted + and −). In this embodiment, the transducers are arranged in a periodic and synchronous fashion (no break in the spacing between the electrodes), i.e. the distance between the centers of the two adjacent electrodes of the two transducers $IDT_1$ and $IDT_2$, denoted in FIG. 3B by 31 and 32 respectively, is equal to the period p of each of the transducers (the period being defined by the distance between the centers of two consecutive electrodes). If the width of the metalization is equal to one half the period p, i.e. approximately $\lambda/4$, the gap between the transducers, denoted in FIG. 3B by d, is substantially equal to the separation between two electrodes (typically $\lambda/4$, where $\lambda$ is the acoustic wavelength). They are connected, as may be seen in FIG. 3B, so as to ensure acoustic synchronization of the two transducers. Thus, the waves generated by the two transducers are in phase (for a frequency close to the central frequency of the filter). In this embodiment (see FIG. 3B), the adjacent electrodes of the two transducers are connected to electrical connection points located on the same side of the acoustic channel. Of course, the connection points for the adjacent electrodes may be located on either side of the acoustic channel, provided that one of the transducers is reversed in order to ensure acoustic synchronization. Other arrangements are possible (for example, the choice of the gap d between the transducers) provided that the waves generated by the two transducers are always in phase.

In the embodiment shown in FIG. 3A, arrays of reflectors (REF) are also placed on either side of the structure. In this example, they are arranged synchronously with respect to the transducers $IDT_1$ and $IDT_2$ and have equal apertures.

The Applicant has shown that with such a structure, unlike that which might be feared by grouping the two transducers together in the same acoustic channel, the response of one transducer is unaffected by the presence of the other. This innocuousness of one transducer relative to the other is obtained by arranging them so as to ensure continuity of the acoustic phase. Supplied with independent, but symmetrical, electrical signals, the transducers work in phase and behave, acoustically, as a single, longer, transducer. The Applicant has thus shown that this interaction not only does not degrade the response of each transducer, but also makes it possible to confine each transducer in a more efficient cavity, since the equivalent length of the cavity for each transducer is longer. This makes it possible in particular to reduce the ripple effects in the response of the filter (defined by its admittance). Compared with two resonators that are physically separated, it is even possible to take advantage of this effect to reduce the length of each transducer compared with the configuration of the prior art in which the transducers are physically separated, thus making it possible to increase the passband. The experiments carried out with the structure according to the invention also show that the transfer losses are lower than in a configuration in which the two transducers are separated.

The invention furthermore makes it possible to reduce the transverse direction of the filter appreciably, since the two transducers lie in the same acoustic channel, and to simplify the topology of the layout of the various elements. Moreover, the area occupied by the single structure of the filter according to the invention is reduced because of the disappearance of two reflector networks (from the four of a filter of the prior art).

Figure 4:
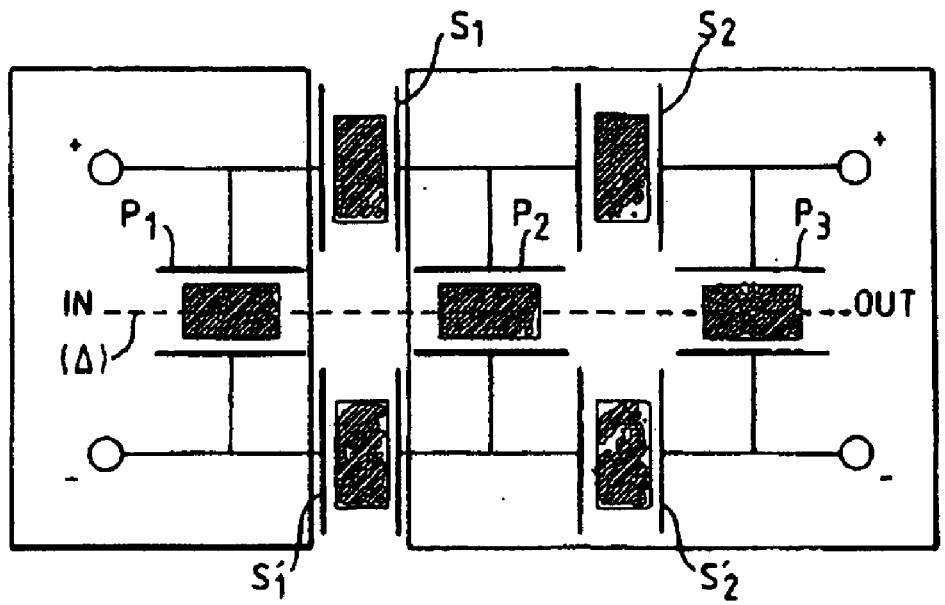
FIG. 4, the circuit diagram of a ladder-type network to which the invention applies.

The application of the invention to a ladder-type network with differential inputs/outputs, as shown in FIG. 4, will now be described. This is a symmetrical network formed from series and parallel branches. The impedance elements of the series branches are denoted by S ($S_1$, $S'_1$, $S_2$ and $S'_2$, respectively, in the embodiment shown in FIG. 4), identical indices relating to elements placed in the network in electrically equivalent positions. The impedance elements of the parallel branches are denoted by P ($P_1$, $P_2$ and $P_3$, respectively, in the embodiment shown in FIG. 4).

Figure 5:
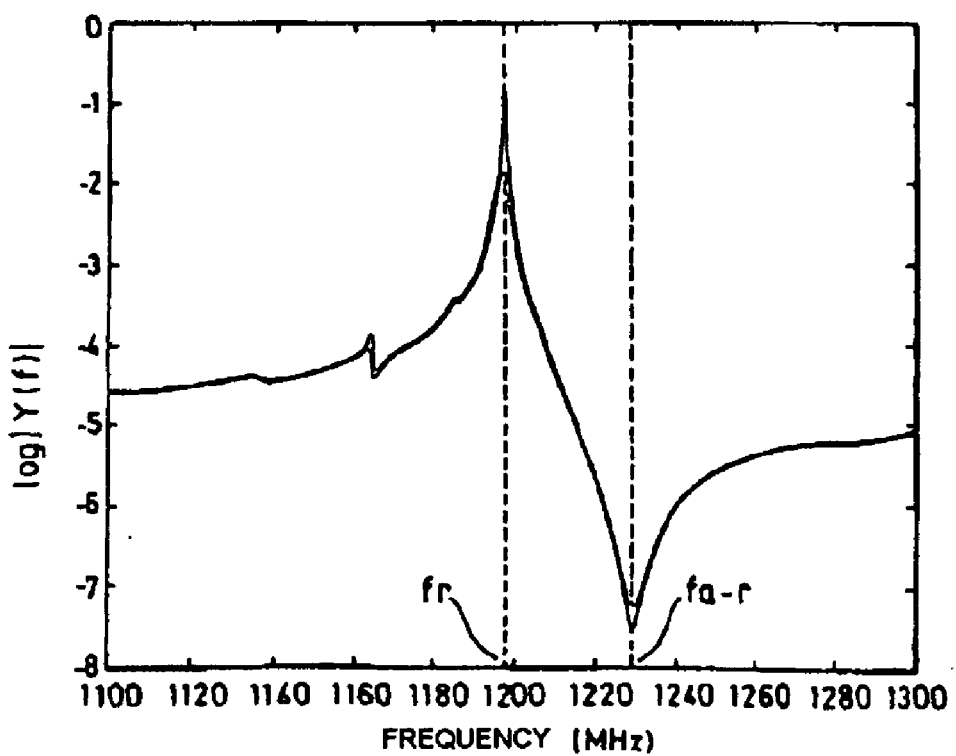
FIG. 5, an example of a curve showing the admittance of an impedance element as a function of frequency in a network of the type of that in FIG. 4.

The operation of a ladder-type SAW filter is conventional and its principle will be described briefly. FIG. 5 illustrates, according to one example, the response of an elementary impedance element, for example a SAW resonator. The curve plots the logarithm of the modulus of the admittance Y(f) as a function of frequency (in MHz). Ideally, a resonator behaves as a short circuit in a narrow frequency band around a resonant frequency ($f_r$) and as an open circuit around its antiresonant frequency ($f_{ar}$). A very simplified description of the operation of a ladder-type filter of the type shown in FIG. 4 may then be given. Within the passband of the series resonators (S), the series branches behave as short circuits and the signal therefore passes directly from the input (IN) to the output (OUT) with a very low insertion loss. The antiresonant frequency of the parallel resonators (P) may be adjusted approximately to the resonant frequency of the series resonators so that they behave as open circuits. Within the passband of the parallel resonators (P), the signal is short-circuited and rejection is excellent on the low-frequency side, making it possible to obtain very good rejection at the start of the passband. The antiresonance of the series resonators makes it possible to obtain good rejection at the end of the passband, on the high-frequency side. In general, the resonant frequency of the parallel resonators is adjusted in order to obtain strong rejection at the start of the passband (low-frequency side), whereas the resonant frequency of the series resonators is adjusted so as to be in the middle of the passband. The various resonant frequencies are generally different in order to allow fine control of the passband shape and rejection position. In the ladder-type networks with differential input/outputs, those elements of the series branches that are placed in electrically equivalent positions are identical, so as to meet the balancing conditions. Thus, in the embodiment shown in FIG. 4, the elements $S_1$ and $S'_1$ are identical, as are the elements $S_2$ and $S'_2$. However, it is not necessary for the elements of one and the same branch to be symmetrical. Thus, the elements $P_1$, $P_2$, and $P_3$, on the one hand, and the elements $S_1$ and $S_2$ or the elements $S'_1$ and $S'_2$, on the other hand, are not necessarily identical.

The invention makes it possible, for example, to group together, in a network of the type shown in FIG. 4, those impedance elements of the series branches that are placed in equivalent positions in the network (in this example, the series elements $S_1$, $S'_1$ on the one hand, and $S_2$, $S'_2$ on the other), as was described above. It also makes it possible, when the parallel branches of the network can each be considered as two parallel branch portions that are symmetrical with respect to an electrical connection point at zero potential, to group together the two impedance elements that are placed in the two symmetrical branch portions.

Figure 6A:
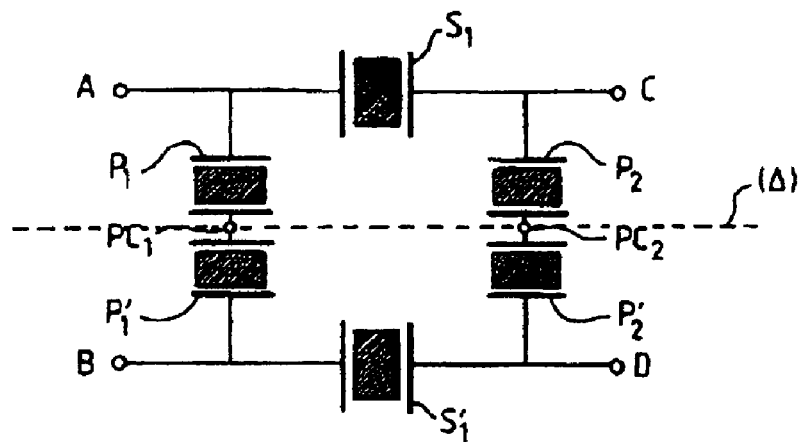
FIGS. 6A and 6B, the circuit diagram of a section of a ladder-type network of impedance elements and a diagram illustrating, according to one embodiment, the construction of said section according to the invention, respectively.
Figure 6B:
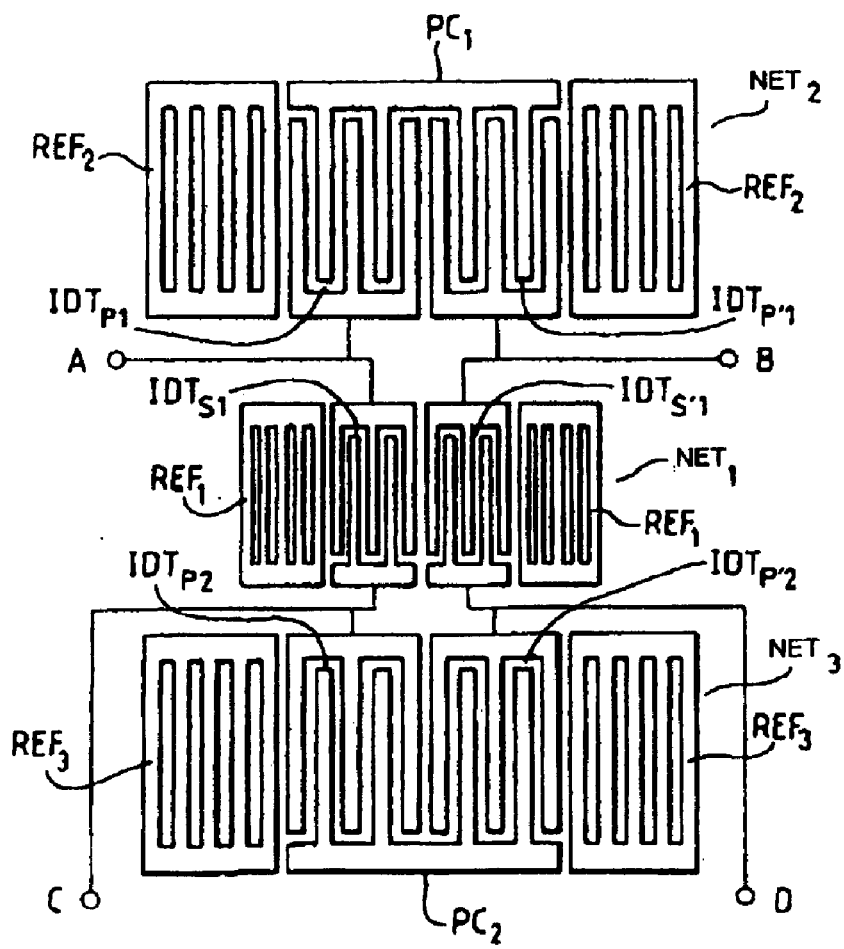

FIGS. 6A and 6B illustrate an embodiment according to the invention of a network of the type shown in FIG. 4. The network consists in this example of two symmetrical sections with differential inputs/output in series, the circuit diagram of one of them being shown in FIG. 6A (inputs A, B and outputs C, D). Each section is formed from two series branches, denoted by [AC] and [BD], between the electrical connection points A and C on the one hand and B and D on the other, and from two parallel branches, denoted by [AB] and [CD], between the connection points A and B on the one hand and C and D on the other. $S_1$ and $S'_1$ are the impedance elements of the series branches. $P_1$ and $P'_1$ are the impedance elements of the two branch portions symmetrical with respect to the zero-potential connection point $PC_1$ of the first parallel branch [AB] and $P_2$ and $P'_2$ are the impedance elements of the two branch portions symmetrical with respect to the zero-potential connection point $PC_2$ of the second parallel branch [CD]. The connection points $PC_1$ and $PC_2$ may be floating or connected to ground.

FIG. 6B illustrates an embodiment according to the invention of the section whose electrical circuit diagram is given by FIG. 6. It is formed from three resonator-type structures, $NET_1$, $NET_2$ and $NET_3$ respectively. The first structure $NET_1$ comprises two substantially identical transducers $IDT_{S1}$ and $IDT_{S'1}$ in the same acoustic channel, these being connected in two series branches of the structure ($IDT_{S'1}$ is connected to the connection points A, C of the first branch and $IDT_{S'1}$ is connected to the two connection points B, D of the second branch) and arranged in such a way that the waves generated by the two said transducers are in phase. The second structure $NET_2$ comprises two substantially identical transducers $IDT_{P1}$ and $IDT_{P'1}$ in the same acoustic channel, each connected, on the one hand, to a first electrical connection point of each transducer of the first structure (A and B respectively), and on the other hand, to a common electrical connection point PC at zero potential (for example connected to ground) and are arranged in such a way that the waves generated by the two said transducers are in phase. Finally, the third structure $NET_3$ comprises two substantially identical transducers $IDT_{P2}$ and $IDT_{P'2}$, in the same acoustic channel, each connected, on the one hand, to the second electrical connection point of each transducer of the first structure (C and D, respectively) and, on the other hand, to a zero-potential common electrical connection point $PC_2$ (for example connected to ground), and arranged in such a way that the waves generated by the two said transducers are in phase. In this example, arrays of reflectors ($REF_1$, $REF_2$, and $REF_3$, respectively) are placed on each side of the structures.

The invention thus makes it possible to simplify the production of the filter, to save space and to achieve better control in balancing the symmetrical branches.

Figure 7A:
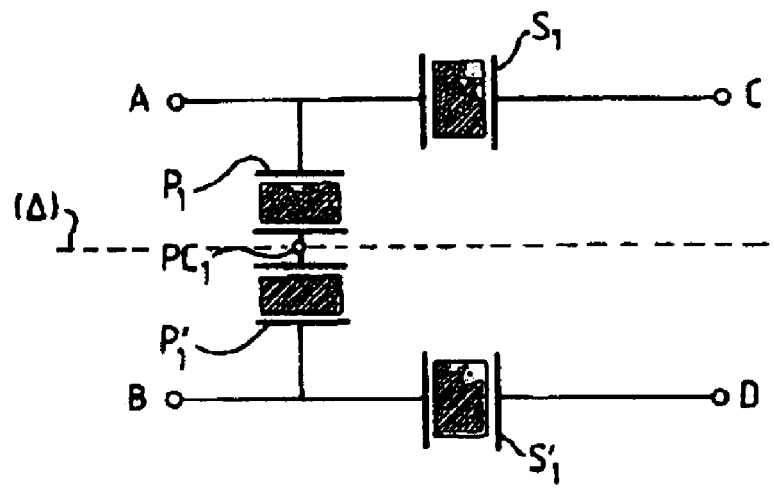
FIGS. 7A and 7B, the circuit diagram and the layout of impedance elements in a ladder-type network according to an alternative embodiment, respectively.
Figure 7B:
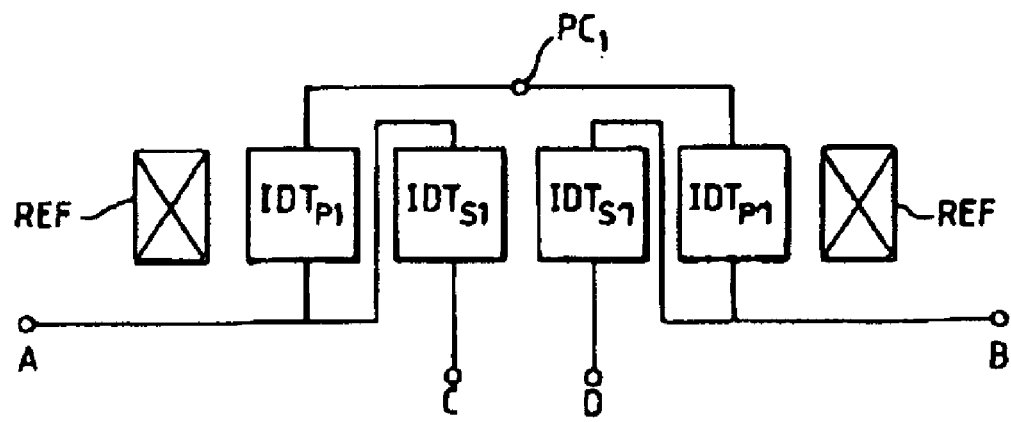

FIGS. 7A and 7B show an alternative embodiment according to the invention of a network of the type shown in FIG. 4. In this embodiment, the aim is to group together, in one and the same resonator-type structure, the elements ($S_1$, $S'_1$) of two series branches and the elements ($P_1$, $P'_1$) of two parallel branch portions that are symmetrical with respect to a zero-potential common electrical connection point $PC_1$. FIG. 7A illustrates the circuit diagram of the various elements in question. FIG. 7B gives the layout of these elements. According to this embodiment, the structure comprises two pairs of transducers in the same acoustic channel. The transducers $ID_{S1}$ and $IDT_{S'1}$ ("S" transducers) forming the first pair are substantially identical, each connected in two series branches [AC] and [BD] of the network (connection points A, C, and B, D respectively). They are arranged in such a way that the waves generated by the two transducers are in phase. The transducers $IDT_{P1}$ and $IDT_{P'1}$ ("P" transducers) forming the second pair are substantially identical, each connected, on the one hand, to a connection point of a transducer of the first pair (A and B respectively in the embodiment shown in FIGS. 7A and 7B) and, on the other hand, to a zero-potential common electrical connection point $PC_1$ (for example connected to ground), and arranged in such a way that the waves generated are in phase. In this example, arrays of reflectors REF are placed on either side of the structure. In this structure, the period of the P transducers is a priori different to that of the S transducers. The transducers $IDT_{P1}$ and $IDT_{S1}$ on the one hand, and $IDT_{S'1}$ and $IDT_{P'1}$ on the other, are not necessarily synchronous but the structure must be symmetrical (the gap between $IDT_{P1}$ and $IDT_{S1}$ is the same as that between $IDT_{S'1}$ and $IDT_{P'1}$).

The invention is not limited to a ladder SAW filter. It applies to any type of symmetrical network with differential inputs/outputs, in which there may be impedance elements located in symmetrical branches and in electrically equivalent positions.

Figure 8A:
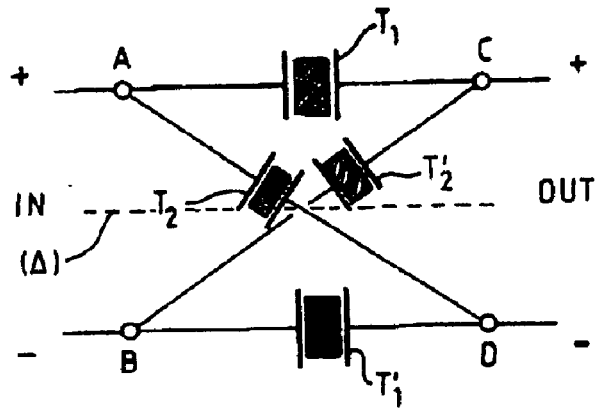
FIGS. 8A, 8B and 8C, the circuit diagram and the layout according to two embodiments of two impedance elements in a balanced bridge type network, respectively.

For example, the invention may be applied to symmetrical networks of the balanced-bridge type, an embodiment of which will be described below. FIG. 8A represents the circuit diagram of a symmetrical balanced-bridge network with differential inputs/outputs (inputs A, B, outputs C, D) comprising four symmetrical branches in pairs, [AC] and [BD] on the one hand and [AD] and [BC] on the other, respectively. The SAW impedance elements are denoted by $T_1$, $T'_1$, $T_2$ and $T'_2$, the elements with the same index corresponding to elements placed in symmetrical branches in electrically equivalent positions.

Figure 8B:
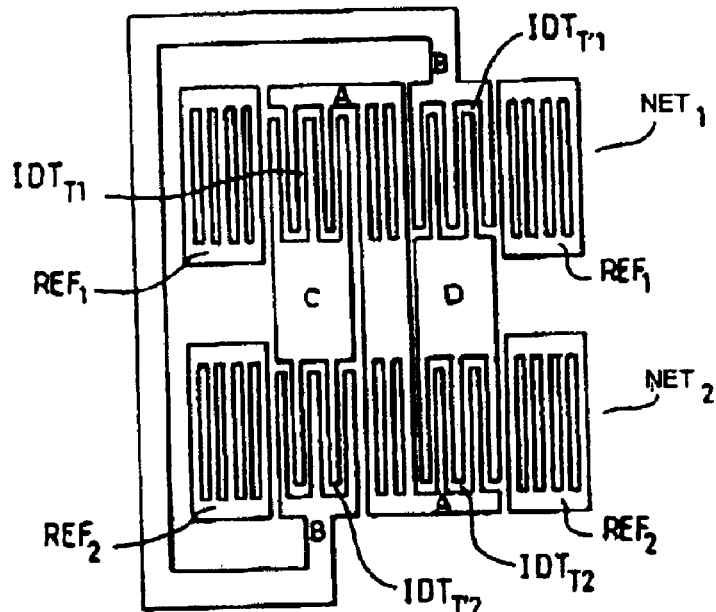
Figure 8C:
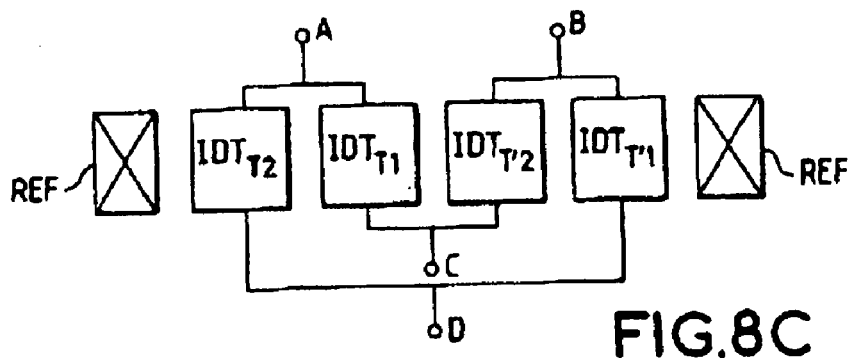

FIGS. 8B and 8C show layouts of impedance elements in a network of the type shown in FIG. 8A according to two embodiments. In the embodiment shown in FIG. 8B, the network according to the invention comprises two resonator-type structures $NET_1$ and $NET_2$. The first structure $NET_1$ comprises two substantially identical transducers $IDT_{T1}$ and $IDT_{T'1}$ connected to two symmetrical branches ([AC], [BD]) of the structure and arranged in such a way that the waves generated by the two said transducers are in phase. The second structure $NET_2$ comprises two substantially identical transducers $IDT_{T2}$ and $IDT_{T'2}$, each connected, on the one hand, to the first and second electrical connection points (A, C) of the first transducer $IDT_{T1}$ of the first structure respectively and, on the other hand, to the second and first electrical connection points (D, B) of the second transducer ($IDT_{T'1}$) of the first structure respectively. They are arranged in such a way that the waves generated by the two transducers are in phase. In this embodiment, arrays of reflectors $REF_1$ and $REF_2$ are also placed on either side of the structures $NET_1$ and $NET_2$. In practice, in the embodiment shown in FIG. 8B, the structures $NET_1$ and $NET_2$ are placed one above the other, making it easier to connect the electrodes of the transducers $IDT_{T1}$ and $IDT_{T2}$ to their common connection point C and to connect the electrodes of the transducers $IDT_{T'1}$ and $IDT_{T'2}$ to their common connection point D. In this embodiment, three dead fingers in each structure, that are placed synchronously between the transducers, allow common connection to the connection point A of the electrodes of the transducers $IDT_{T1}$ of the first structure and $IDT_{T2}$ of the second structure, respectively.

FIG. 8C shows a layout of another embodiment according to the invention of a network of the type of that illustrated in FIG. 8A; as in the embodiment shown in FIG. 7B, the structure comprises two pairs of transducers in the same acoustic channel. The transducers $IDT_{T1}$ and $IDT_{T'1}$ forming the first pair are substantially identical, each connected to two symmetrical branches of the network (electrical connection points A, C and B, D, respectively). They are arranged in such a way that the waves generated by the two transducers are in phase. The transducers $IDT_{T2}$ and $IDT_{T'2}$ forming the second pair are substantially identical, each connected on the one hand, to the first and second electrical connection points (A, C) of the first transducer $IDT_{T1}$ of the first structure respectively and, on the other hand, to the second and first electrical connection points (D, B) of the second transducer ($IDT_{T'1}$) of the first structure, respectively, and arranged in such a way that the waves generated are in phase. In this embodiment, arrays of reflectors REF are also placed on either side of the structure.

Advantageously, the SAW filters according to the invention as described above apply to mobile or stationary communication systems. They operate, for example, in radiofrequency (RF) mode or intermediate frequency (IF) mode. For this type of application, the input point is an antenna whose signal is generally referenced with respect to ground; it is therefore differential by nature. The filter may then include a transformer-type component that transforms a nondifferential input into a differential input, which in turn is applied to said network with differential inputs/outputs according to the invention. Reciprocally, the network may also be connected on the output side to a component that transforms the differential output to a nondifferential output.

This transformer is, for example, a BALUN (BALanced input/UNbalanced output)-type transformer. This type of component may have the drawback of introducing ohmic losses that reduce the performance of the system. It is then possible to insert, into the filter according to the invention, a known acoustic structure of the DMS/CRF type which has a transformer function and is connected to the network with differential inputs/outputs having the features of the invention.

Figure 9A:
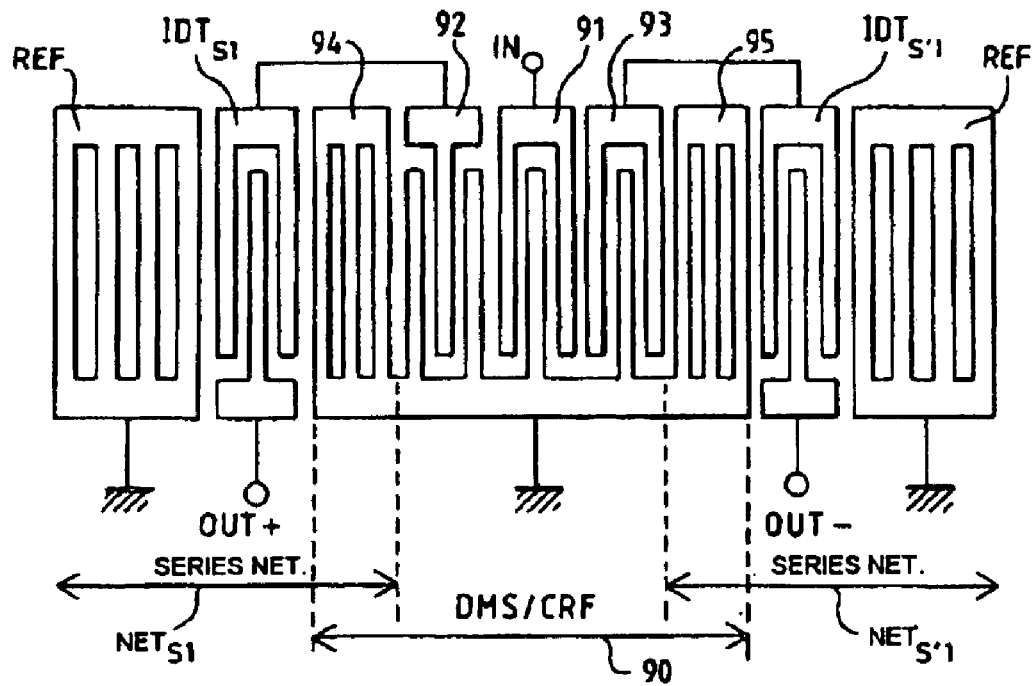
FIGS. 9A and 9B, two other embodiments of filters according to the invention that incorporate a DMS/CRF stage.
Figure 9B:
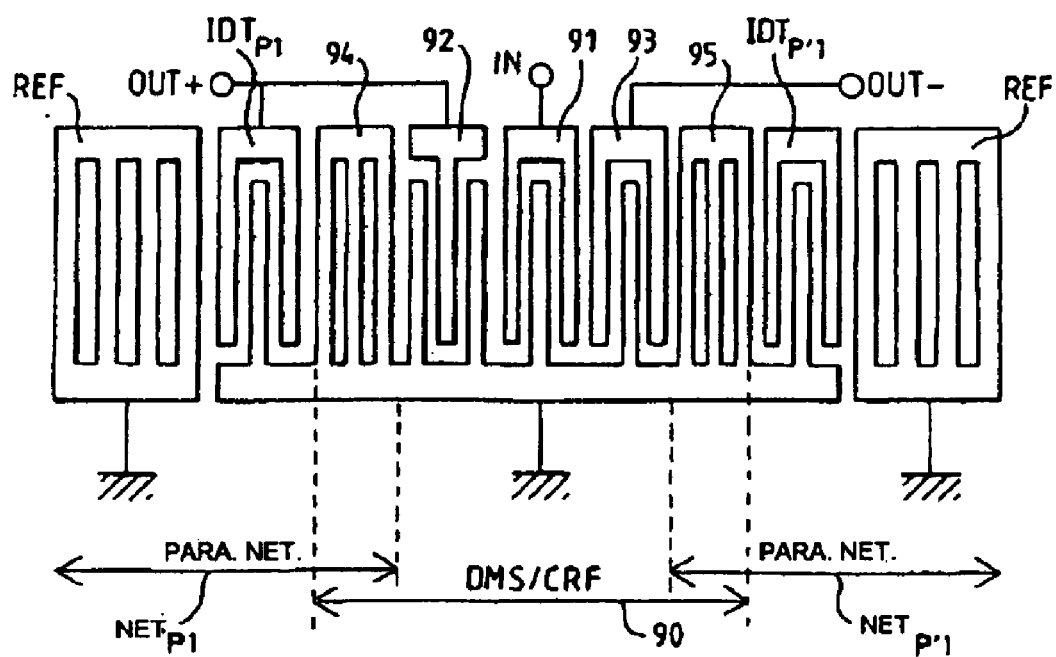

According to an alternative embodiment of the invention, the surface acoustic wave filter includes a DMS/CRF-type structure acoustically connected to two impedance elements of a ladder-type network. FIGS. 9A and 9B illustrate by layout two examples of acoustic connection of the DMS/CRF structure to two impedance elements connected in symmetrical branches of the network, either series (FIG. 9A) or parallel (FIG. 9B).

Thus, at the center there is a DMS/CRF-type stage (denoted by 90) composed of a central transducer 91, two lateral transducers 92 and 93 and two arrays of reflectors 94 and 95. The central transducer is loaded nondifferentially and the two lateral transducers have reverse polarities; they therefore have opposed signals on their connection buses. According to the embodiment illustrated here, the lateral transducers are connected to "series" transducers ($IDT_{S1}$ and $IDT_{S'1}$) in the case of FIG. 9A or to parallel transducers ($IDT_{P1}$ and $IDT_{P'1}$) in the case of FIG. 9B. The "series" transducers are transducers connected to two symmetrical series branches of the ladder network and the two "parallel" transducers are two transducers connected to parallel branches of the ladder network, as was described in the previous embodiments. Arrays of reflectors denoted by REF in FIGS. 9A and 9B complete the structure in order to form the series networks $NET_{S1}$ and $NET_{S'1}$ in FIG. 9A and the parallel networks $NET_{P1}$ and $NET_{P'1}$ in FIG. 9B.

It may be useful to insert reflector arrays between the stages. In this way, a more symmetrical layout is obtained. This type of composed stage may even be electrically cascaded with another network of impedance elements or optionally another type of SAW filter stage.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

What is claimed is:

1. A surface acoustic wave filter, comprising:
   a symmetrical network of impedance elements with differential inputs/outputs, each impedance element being connected between two connection points of the network and having, between these connection points, an admittance ($Y(f)$) having a resonant frequency ($f_r$) and an antiresonant frequency ($f_{ar}$) that define the rejection frequencies of said filter,
   said two of said impedance elements are each connected between two electrical connection points forming two symmetrical branches of the network and supplied, when the filter is in operation, with substantially the same voltage and substantially the same current flowing through them, said impedance elements are grouped together to form a structure of the surface acoustic wave resonator type that comprises, in one and the same acoustic channel, two substantially identical transducers, two electrodes of which are connected to said connection points of said symmetrical branches of the network, respectively, and are positioned with respect to each other in such a way that the acoustic waves generated by the two said transducers are in phase;
   wherein when the network is of the ladder type, composed of series and parallel branches, the parallel branches of the network being composed of two portions of the same parallel branch that are symmetrical with respect to a zero-potential electrical connection point, two of said impedance elements, each connected between two electrical connection points forming, respectively, two parallel branch portions, with a common connection point formed from said zero-potential connection point, are grouped together to form said structure of the surface acoustic wave resonator type,
   wherein said network of said impedance elements is of the ladder type, comprising one or more symmetrical segments in series, each formed from two series branches and two parallel branches and in that the impedance elements of each section are grouped together to form three said structures of the surface acoustic wave resonator type, a first structure comprising two transducers, the electrodes of which are connected to the connection points of two series branches of the structure, a second structure comprising two transducers, the electrodes of which are each connected, on the one hand, to an electrical connection point of each transducer of the first structure and, on the other hand, to a zero-potential common electrical connection point and a third structure comprising two transducers, the electrodes of which are each connected on the one hand, to the second electrical connection point of each transducer of the first structure and, on the other hand, to a zero-potential common electrical connection point.

2. A surface acoustic wave filter, comprising:
   a symmetrical network of impedance elements with differential inputs/outputs, each impedance element being connected between two connection points of the network and having, between these connection points, an admittance ($Y(f)$) having a resonant frequency ($f_r$) and an antiresonant frequency ($f_{ar}$) that define the rejection frequencies of said filter,
   said two of said impedance elements are each connected between two electrical connection points forming two symmetrical branches of the network and supplied, when the filter is in operation, with substantially the same voltage and substantially the same current flowing through them, said impedance elements are grouped together to form a structure of the surface acoustic wave resonator type that comprises, in one and the same acoustic channel, two substantially identical transducers, two electrodes of which are connected to said connection points of said symmetrical branches of the network, respectively, and are positioned with respect to each other in such a way that the acoustic waves generated by the two said transducers are in phase;
   wherein when the network is of the ladder type, composed of series and parallel branches, the parallel branches of the network being composed of two portions of the same parallel branch that are symmetrical with respect to a zero-potential electrical connection point, two of said impedance elements, each connected between two electrical connection points forming, respectively, two parallel branch portions, with a common connection point formed from said zero-potential connection point, are grouped together to form said structure of the surface acoustic wave resonator type.

3. The filter as claimed in claim 2, wherein when the network is of the ladder type, composed of series and parallel branches, two of said impedance elements, each connected between two electrical connection points forming two series branches of the network respectively, are grouped together to form said structure of the surface acoustic wave resonator type.

4. The filter as claimed in claim 2, wherein at least one of said connection points is connected to ground.

5. The filter as claimed in claim 2, wherein said network of said impedance elements is of the ladder types comprising one or more symmetrical segments in series, each formed from two series branches and two parallel branches, and in that the impedance elements of each section are grouped together to form three said structures of the surface acoustic wave resonator type, a first structure comprising two transducers, the electrodes of which are connected to the connection points of two series branches of the structure, a second structure comprising two transducers, the electrodes of which are each connected, on the one hand, to an electrical connection point of each transducer of the first structure and, on the other hand, to a zero-potential common electrical connection point and a third structure comprising two transducers, the electrodes of which are each connected on the one hand, to the second electrical connection point of each transducer of the first structure and, on the other hand, to a zero-potential common electrical connection point.

6. The filter as claimed in claim 5, wherein said zero-potential connection points are connected to ground.

7. The filter as claimed in claim 2, wherein when the network is of the ladder type, composed of series and parallel branches, at least one of said structures of the surface acoustic wave resonator type comprises two pairs of transducers, in the same acoustic channel, the electrodes of the transducers of the first pair being connected to the connection points of two series branches of the network, and the electrodes of the transducers of the second pair being each connected, on the one hand, to an electrical connection point of a transducer of the first pair and, on the other hand, to a zero-potential common electrical connection point.

8. The filter as claimed in claim 6, wherein said zero-potential connection point is connected to ground.

9. The filter as claimed in claim 2, wherein when the network is of the balanced-bridge type, composed of four symmetrical branches in pairs, the network comprises two of said structures of the surface acoustic wave resonator type, a first structure comprising two transducers, the electrodes of which are connected to the connection points of two symmetrical branches of the structure, a second structure comprising two transducers, the electrodes of which are each connected, on the one hand, to the first and second electrical connection points of the first transducer of the first structure, respectively, and, on the other hand, to the second and first electrical connection points of the second transducer of the first structure, respectively.

10. A mobile or stationary communication system, including an RF or IF frequency filter as claimed in claim 2.

11. The filter as claimed in claim 2, wherein the two said transducers of the structure are positioned with respect to each other in a periodic and synchronous manner, such that the adjacent electrodes of the two transducers are connected to electrical connection points located on the same side of the acoustic channel.

12. The filter as claimed in claim 2, wherein the two said transducers of the structure are positioned with respect to each other in a periodic and synchronous manner, such that the adjacent electrodes of the two transducers are connected to connection points located on either side of the acoustic channel.

13. The filter as claimed in claim 2, wherein arrays of reflectors (REF) are placed on either side of each structure of the surface acoustic wave resonator type.

14. The filter as claimed in claim 13, wherein the arrays of reflectors are positioned synchronously with the transducers of the structure.

15. The filter as claimed in claim 13, wherein the reflectors and the transducers of a structure have equal apertures.

16. The filter as claimed in claim 13, wherein the reflectors and the transducers of a structure have the same period.

17. The filter as claimed in claim 2, wherein said filter furthermore includes a transformer stage produced as a SAW filter, which transforms a nondifferential input into a differential input, which in turn is applied to said network with differential inputs/outputs.

18. The filter as claimed in claim 17, wherein when the network is of the ladder type composed of series and parallel branches, the transformer stage is acoustically connected to the transducers whose electrodes are connected to the connection points of the series branches of the network or to the transducers whose electrodes are connected to the connection points of the parallel branches of the network.

19. The filter as claimed in claim 15, wherein the reflectors and the transducers of a structure have the same period.

20. A surface acoustic wave filter, comprising:
a symmetrical network of impedance elements with differential inputs/outputs, each impedance element being connected between two connection points of the network and having, between these connection points, an admittance (Y(f)) having a resonant frequency ($f_r$) and an antiresonant frequency ($f_{ar}$) that define the rejection frequencies of said filter, said two of said impedance elements are each connected between two electrical connection points forming two symmetrical branches of the network and supplied, when the filter is in operation, with substantially the same voltage and substantially the same current flowing through them, said impedance elements are grouped together to form a structure of the surface acoustic wave resonator type that comprises, in one and the same acoustic channel, two substantially identical transducers, two electrodes of which are connected to said connection points of said symmetrical branches of the network, respectively, and are positioned with respect to each other in such a way that the acoustic waves generated by the two said transducers are in phase;

wherein when the network is of the ladder type, composed of series and parallel branches, the parallel branches of the network being composed of two portions of the same parallel branch that are symmetrical with respect to a zero-potential electrical connection point, two of said impedance elements, each connected between two electrical connection points forming, respectively, two parallel branch portions, with a common connection point formed from said zero-potential connection point, are grouped together to form said structure of the surface acoustic wave resonator type, wherein when the network is of the balanced-bridge type, composed of four symmetrical branches in pairs, the network comprises two of said structures of the surface acoustic wave resonator type, a first structure comprising two transducers, the electrodes of which are connected to the connection points of two symmetrical branches of the structure, a second structure comprising two transducers, the electrodes of which are each connected, on the one hand, to the first and second electrical connection points of the first transducer of the first structure, respectively, and, on the other hand, to the second and first electrical connection points of the second transducer of the first structure, respectively.

21. The filter as claimed in claim 20, wherein when the network is of the balanced-bridge type, composed of four symmetrical branches in pairs, the network comprises one of said resonator-type structures with two pairs of transducers, in the same acoustic channel, the electrodes of the transducers of the first pair being connected to the connection points of two symmetrical branches of the network, the electrodes of the transducers of the second pair being each connected, on the one hand, to the first and second electrical connection points of the first transducer of the first structure respectively and, on the other hand, to the second and first electrical connection points or the second transducer of the first structure, respectively.

* * * * *